United States Patent
Shorrocks et al.

[11] Patent Number: 5,942,791
[45] Date of Patent: Aug. 24, 1999

[54] MICROMACHINED DEVICES HAVING MICROBRIDGE STRUCTURE

[75] Inventors: Nicholas M Shorrocks, Northhampton; Martin J Walker, Lings; Ralph Nicklin, Northampton; Andrew D Parsons, Weedon, all of United Kingdom

[73] Assignee: GEC-Marconi Limited, United Kingdom

[21] Appl. No.: 08/811,410

[22] Filed: Mar. 4, 1997

[30] Foreign Application Priority Data

Mar. 6, 1996 [GB] United Kingdom .................... 9604786
Dec. 11, 1996 [GB] United Kingdom .................... 9925722

[51] Int. Cl.$^6$ .................................................. H01L 29/00
[52] U.S. Cl. ............................................ 257/522; 257/276
[58] Field of Search .................................. 257/276, 428, 257/467, 522, 278

[56] References Cited

U.S. PATENT DOCUMENTS

| | | | |
|---|---|---|---|
| 3,846,820 | 11/1974 | Lampe et al. ............................ | 257/522 |
| 4,682,503 | 7/1987 | Higashi et al. . | |
| 5,070,026 | 12/1991 | Greenwald et al. ..................... | 257/428 |
| 5,148,260 | 9/1992 | Inoue et al. ............................. | 257/276 |
| 5,227,658 | 7/1993 | Beyer et al. ............................. | 257/522 |
| 5,369,280 | 11/1994 | Liddiard .................................. | 257/467 |
| 5,406,109 | 4/1995 | Whitney .................................. | 257/467 |
| 5,446,284 | 8/1995 | Butler et al. . | |
| 5,521,406 | 5/1996 | Tserng et al. ........................... | 257/276 |
| 5,572,060 | 11/1996 | Butler et al. ............................ | 257/467 |
| 5,600,174 | 2/1997 | Reay et al. .............................. | 257/467 |
| 5,647,946 | 7/1997 | Belcher et al. .......................... | 257/467 |
| 5,682,053 | 10/1997 | Wiszniewski ........................... | 257/522 |
| 5,726,480 | 3/1998 | Pister ...................................... | 257/522 |

FOREIGN PATENT DOCUMENTS

| | | |
|---|---|---|
| 0 138 023 A2 | 4/1985 | European Pat. Off. . |
| 0 319 871 A1 | 12/1988 | European Pat. Off. . |
| 0 534 768 A1 | 3/1993 | European Pat. Off. . |
| 0 539 311 A2 | 4/1993 | European Pat. Off. . |
| 0 701 135 A1 | 3/1996 | European Pat. Off. . |
| 2 194 344 | 3/1988 | United Kingdom . |
| 2 200 246 | 7/1988 | United Kingdom . |
| WO 94/05046 | 3/1994 | WIPO . |

*Primary Examiner*—Nathan K. Kelly
*Attorney, Agent, or Firm*—Kirschstein et al.

[57] ABSTRACT

A method of fabricating a microbridge structure for a thermal detector array comprises growing a planarising layer on a substrate, growing a ferroelectric material layer on the planarising layer and then etching the planarising layer away, either wholly or partially, to leave a ferroelectric microbridge having a uniform thickness. The planarising layer may be a sacrificial layer or may comprise a sacrificial layer as well as other layers.

13 Claims, 3 Drawing Sheets

MICROMACHINED DEVICES HAVING MICROBRIDGE STRUCTURE

BACKGROUND OF THE INVENTION

This invention relates to a method of fabricating a microbridge structure for a micromachined device. It is particularly, but not exclusively, related to fabricating a microbridge for a radiation detector element.

The use of the pyroelectric effect in thermal detectors is well established. In one embodiment a known thermal detector has a 2-dimensional array of thermal detector elements coupled to a readout circuit to give a staring imaging device. The detector elements are comprised of ferroelectric material. Various technologies have been developed to manufacture such detectors. These include hybrid technologies where the readout circuit and ferroelectric element array are fabricated separately and joined in a bonding process such as flip-chip bump bonding. Alternatively integrated technologies are used in which the array is fabricated from a thin film of ferroelectric material deposited directly onto the readout circuit. The detector elements are then defined by micromachining processes.

A requirement for thermal detector elements is thermal isolation from the substrate, which can be achieved by forming microbridge structures separated from the substrate except for very small links. Separation from the substrate is achieved by fabricating the microbridge structure over an etchable sacrificial layer which is removed after the microbridge has been formed.

The ferroelectric materials may be used below their Curie temperature after poling (for pyroelectric devices) or above the Curie temperature with an applied electric DC bias field (for dielectric bolometer devices).

Some processes for deposition of ferroelectric thin films (for example deposition from solution) are planarising processes, where the growing film tends to be smoother than the substrate surface upon which it is grown. It is often the case that the circuit on which the ferroelectric thin film is deposited, for example a readout circuit, is not planar but is uneven having circuit features such as interconnecting tracks and vias. If a ferroelectric film is deposited on such an uneven surface, this can cause problems with the performance of thermal detector elements because the film thickness varies with position on the circuit. As a consequence it is not possible to achieve a uniform electric field across all of the ferroelectric film during poling (for pyroelectric devices) or in operation (for dielectric bolometer devices).

The electric field applied to the film is dependent upon the film thickness. For very thin regions the voltage applied across the film has to be limited to avoid breakdown of the film. In this event a reduced electric field is applied over thicker regions of the film. This will lead to loss of radiometric performance and an increased tendency to break down under an applied field either during poling or in operation.

One method of tackling the problem of uneven film thickness is to micromachine microbridges on planar areas of the substrate which are not covered by surface features such as tracks and vias. However this reduces the fill factor on the substrate and leads to the ferroelectric array having a sparse distribution. This is inefficient in using up the space on the substrate which is disadvantageous because a higher fill factor produces better imaging.

It is an aim of the invention to overcome at least some of the problems set out above.

SUMMARY OF THE INVENTION

According to a first aspect the invention provides a method of fabricating a microbridge structure on a substrate comprising the steps of: growing a planarising layer on the substrate, the planarising layer comprising a sacrificial layer; growing a layer of active material on the planarising layer; and etching away the sacrificial layer to leave a microbridge of active material having a substantially uniform thickness.

A planarising layer is a layer which is deposited on a layer receiving surface and produces a planar surface irrespective of the topography of the layer receiving surface. It may be that planarising occurs as the planarising layer is deposited or that planarising occurs in a step after the planarising layer is deposited.

The planarising layer may comprise a single layer which both performs a planarising function and is sacrificial. Alternatively there may be individual layers, at least one of which performs the planarising function and at least one of which is sacrificial. However if there are individual layers, the layer or layers which perform the planarising function may also be etched away either wholly or in part. There may be two or more layers in the planarising layer. They may be deposited sequentially.

The planarising layer may comprise polyimide, zinc oxide and/or spin-on glass. Alternatively the planarising layer may comprise a material such as silicon dioxide which is deposited and then made planar, for example by a polishing technique such as chemical mechanical polishing.

In an embodiment in which the planarising layer comprises a sacrificial layer and a layer which performs a planarising function, the sacrificial layer may overlie the layer which performs the planarising function or vice versa.

In an embodiment in which the planarising layer comprises two or more layers, all of the layers may be etched away leaving a gap defined by the substrate and an opposing face of the ferroelectric layer. Alternatively one or more layers may not be etched away and may remain. The layer which performs the planarising function may not be etched away.

In one embodiment the planarising layer comprises a non-planarising sacrificial layer which is planarised with a flowable material, for example a photoresist. The flowable material may be etched back. Only flowable material may be etched back or some sacrificial layer may be etched back also.

Preferably the layer which performs the planarising function is deposited by a sol-gel technique.

Preferably the layer which preforms the planarising function is not the layer of active material.

Preferably the microbridge structure is for a device which uses the pyroelectric effect. The microbridge structure may be a thermal detector element. It may be a thermal detector element for a 2D imaging thermal detector array. Such an element may be used to detect infra red (IR) radiation, particularly in the ranges 3 to 5 $\mu$m and 8 to 14 $\mu$m. Alternatively the microbridge structure may be a detector element to detect electromagnetic radiation in parts of the spectrum other than IR, including visible radiation, X rays and others.

The invention may be applicable to ultrasonic imaging devices and/or inertial devices including accelerometers and gyroscopes.

Preferably the active material comprises a ferroelectric material. The ferroelectric material may comprise lead zirconium tantalate (PZT), lead lanthanum titanate (PLT) or lead scandium tantalate (PST). Conveniently the layer of active material may be formed by deposition from solution and/or a sol-gel technique.

Preferably the microbridge structure is fabricated on a silicon substrate. Most preferably it is fabricated on a readout circuit device.

According to a second aspect the invention provides a microbridge structure fabricated in accordance with the first aspect of the invention.

According to a third aspect the invention provides an optoelectronic device comprising a microbridge structure in accordance with the second aspect of the invention.

BRIEF DESCRIPTION OF THE DRAWINGS

Examples of the invention will now be described, by way of example only, with reference to the accompanying figures in which.

DETAILED DESCRIPTION OF THE PREFERRED EMBODIMENTS

Figure 1:
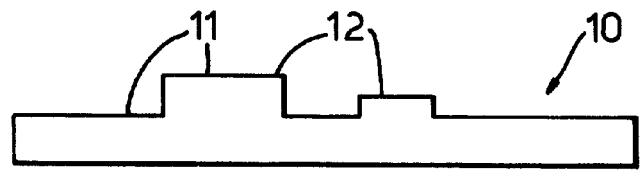
FIG. 1 shows a schematic side view of an uncoated readout circuit.

FIG. 1 shows a side view of a small part of a readout circuit 10 (generally on silicon) before fabrication of a microbridge has begun. The circuit 10 has an upper surface 11. The surface topography of the circuit 10 corresponds to features 12 such as interconnecting tracks and vias. The features 12 are between 1 $\mu$m and 1.5 $\mu$m in height. They produce an uneven surface on which layers are deposited.

Figure 2:
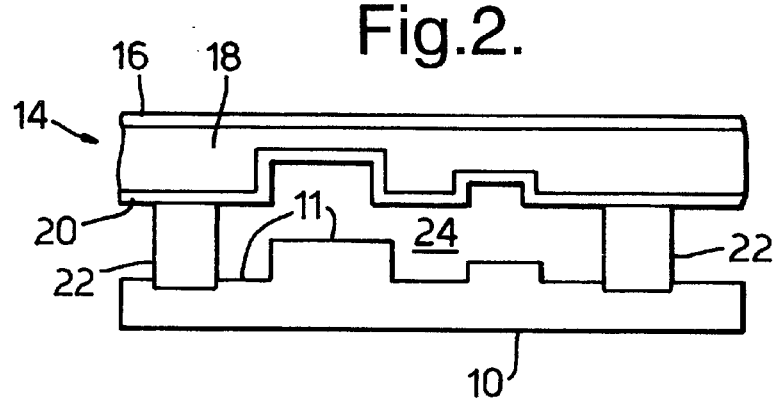
FIG. 2 shows a microbridge fabricated by micromachining on the circuit of FIG. 1.

FIG. 2 shows a ferroelectric microbridge fabricated on the readout circuit 10 by using known micromachining methods. A microbridge 14 comprises a top electrode 16 (made of titanium), a ferroelectric layer 18, and a bottom electrode 20 (made of platinum). The ferroelectric layer 18 is either lead zirconate titanate (PZT) or lead scandium tantalate (PST) and is deposited by the deposition from solution method. The microbridge 14 is supported on bridge supports 22.

A gap 24 is created between the surface of the readout circuit 10 and the opposing face of the microbridge 14 (the bottom electrode 20). The gap is in the region of about 2 $\mu$m high. It is this gap which provides substantial thermal isolation of the microbridge 14 from the circuit 10.

The ferroelectric layer 18 varies in thickness throughout its extent. This is because in fabrication the circuit 10 is coated with a sacrificial layer which conforms to its surface 11. This creates an uneven sacrificial layer surface on which the bottom electrode 20 and the ferroelectric layer 18 are deposited. The ferroelectric layer 18 is planarising and therefore its thickness varies. After deposition of the ferroelectric layer 18 the sacrificial layer is etched away.

Figure 3:
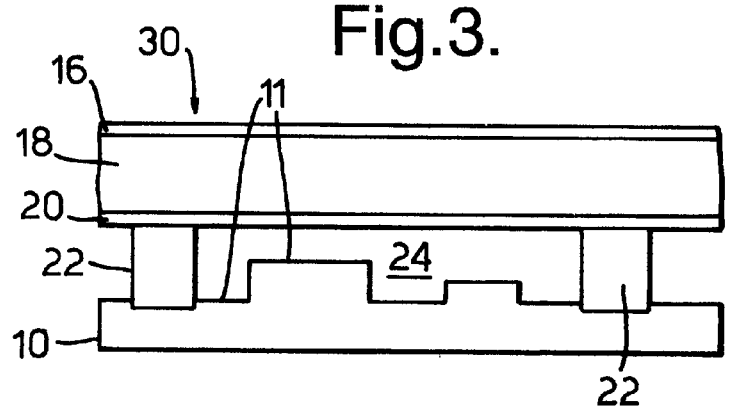
FIG. 3 shows a microbridge fabricated according to the invention.

FIG. 3 shows a ferroelectric microbridge 30 which has been fabricated according to the invention. The microbridge 30 is similar to microbridge 14 of FIG. 2 and corresponding reference numerals have been applied to corresponding features. The main difference in the microbridge of FIG. 3 is that the ferroelectric layer 18 has a uniform thickness and has a planar undersurface which does not conform to the topography of the surface 11. Steps involved in planarising the substrate before fabricating the microbridge 30 are shown in FIGS. 4 to 7.

Figure 4:
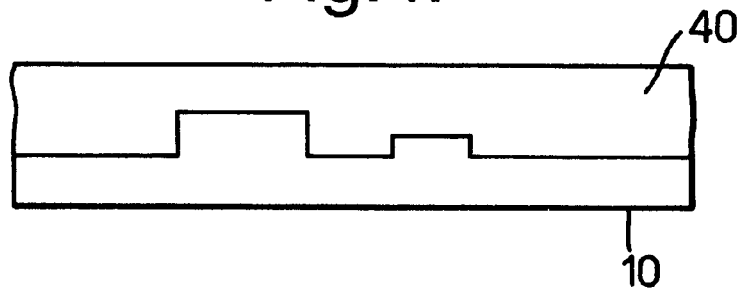
FIGS. 4 to 7 show steps in the fabrication of the microbridge of FIG. 3.

FIG. 4 shows a single planarising layer 40 applied to the substrate 10. In this example the layer 40 has been deposited from solution. It may be zinc oxide deposited by a sol-gel method. However other methods of depositing this layer may be used including reflow of the layer 40 in which a spin-on glass (SOG) is spun on and then etched back. This may be done in combination with chemical vapour deposition, for example a CVD layer may be deposited before the SOG, after the SOG or both before and after the SOG.

In this example the planarising layer 40 is a sacrificial layer. A microbridge structure such as that shown in FIG. 3 (reference numerals 16, 18, 20) is deposited on the planarising layer 40 by using conventional methods which are well known in the art. The layer 40 is subsequently to be etched away.

Figure 5:
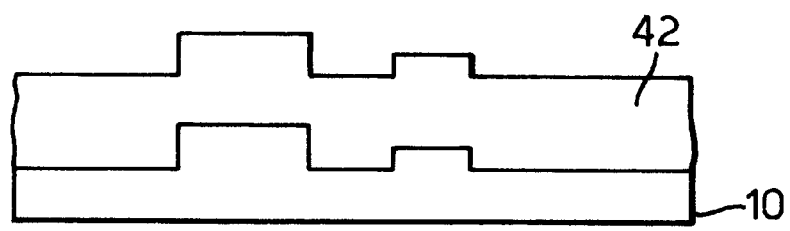
Figure 6:
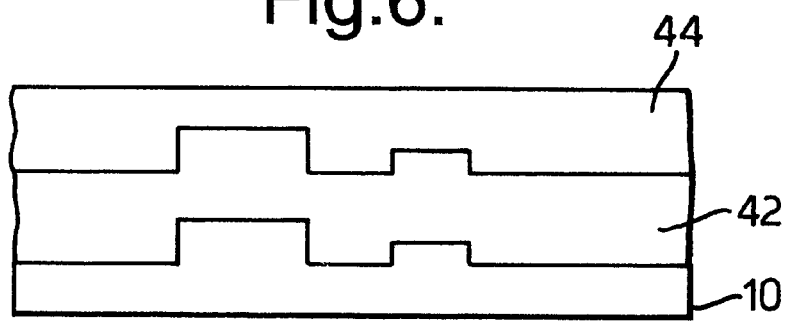

FIG. 5 shows a substrate 10 to which has been applied a sacrificial layer 42. The sacrificial layer 42 is non-planarising and has been deposited by a technique which produces a layer which conforms to the topography of the substrate surface 11. In this example the sacrificial layer 42 is chromium which has been deposited by sputtering.

Figure 7:
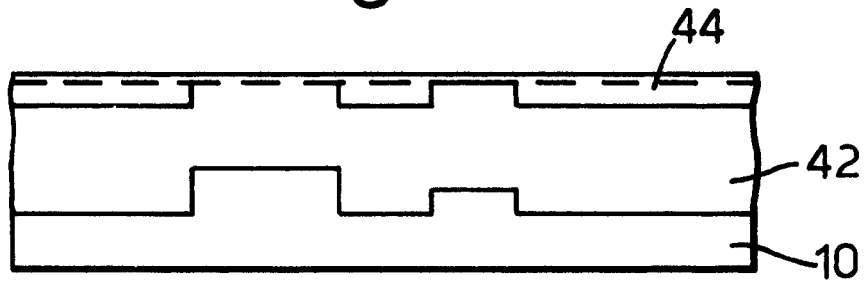

The sacrificial layer 42 (which may be polyimide) is planarised by overcoating with a flowable layer 44, such as photoresist, which is then reflowed to achieve a planar surface. Alternatively the layer 44 may be a planarising material such as a spin-on glass. This produces the structure shown in FIG. 6. The layer 44 is etched back by dry etching (FIG. 7 shows a partly removed flowable layer 44 during the etching process) until either the highest point of the sacrificial layer has been reached or until substantially all of the flowable layer 44 has been removed. In the latter case, this requires an etching process giving identical etching rates for the sacrificial layer 42 and flowable layer 44 in order to achieve a planar surface on the sacrificial layer at the end of the etching process. A suitable dry etching process is reactive ion etching (RIE) in oxygen or plasma ashing in oxygen. Any other example of flowable layer 44 is photoresist (which can be reflowed by heating to a suitable temperature).

Figure 8:
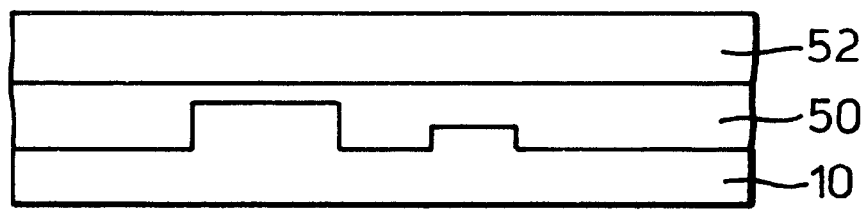
FIG. 8 shows a step in an alternative fabrication method.

FIG. 8 shows a step in a method in which an underlayer 50 is used to produce a planar surface before deposition of a sacrificial layer 52. The underlayer 50 is a planarising layer of the type discussed above in relation to the other examples. The sacrificial layer 52 grown on the underlayer 50 will naturally be planar itself.

In the above examples the planarising layer may be a flowable resist or a polyimide. The polyimide may be deposited by spin coating of a precursor solution followed by a high temperature cure. An alternative planarising layer is zinc oxide deposited by the deposition from solution method. The sacrificial layer may be chromium deposited by sputtering.

An alternative planarising layer may be a conformal layer (which conforms to underlying surface topography) which is polished to be planar. A suitable polishing technique is chemical mechanical polishing. A substrate, such as a silicon wafer, has deposited on it a conformal layer of dielectric material, for example silicon dioxide or silicon nitride, having a thickness at least as great as the difference in height between the highest and lowest points of the wafer. A suitable thickness is about 3 µm. The conformal layer may be deposited by a chemical vapour deposition process such as Plasma Enhanced Chemical Vapour Deposition (PECVD). The conformal layer is made planar by chemical mechanical polishing. The substrate or silicon wafer is mounted in a wafer chuck which is used to press the conformal layer onto a polishing pad with controlled pressure. The polishing pad consists typically of a polyurethane impregnated felt material. A polishing slurry consisting of abrasive particles (such as colloidal silica) in an alkaline solution (such as aqueous KOH at a PH of 10–11) is fed at a controlled rate onto the polishing pad. Polishing occurs during relative rotation between the polishing pad and the wafer. Conventionally both are rotated. Polishing continues until sufficient of the conformal layer has been removed to give it a completely planar surface. The remaining slurry is then cleaned from the wafer surface before deposition of the sacrificial layer can take place.

Figure 9:
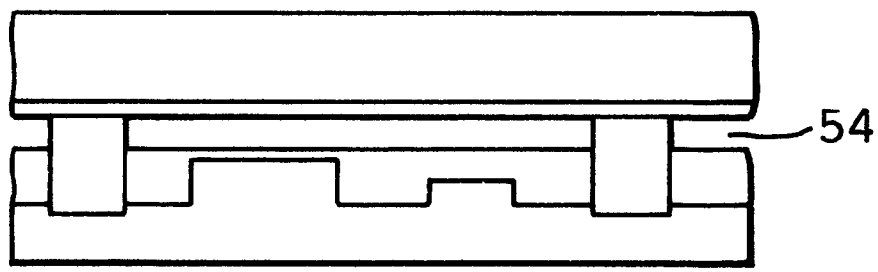
FIG. 9 shows a microbridge fabricated according to the alternative fabrication method.

In subsequent fabrication a ferroelectric layer is deposited on the sacrificial layer 52. The underlayer 50 and sacrificial layer 52 are then etched away to provide a gap between the substrate and a microbridge comprised by the ferroelectric layer. Alternatively only the underlayer may be removed which would lead to a structure as shown in FIG. 9 having a narrower and more uniform gap 54. With a uniform gap 54, if the ferroelectric is made very thin, and non-reflecting to IR radiation, a uniform quarter wave gap under the ferroelectric results in a tuned cavity structure which absorbs IR radiation very efficiently.

The invention provides a method for producing microbridges having a uniform thickness. Although in the foregoing reference has been made to microbridges for thermal detector arrays the invention is not limited solely to this application and may be used to fabricate microbridges in other micromachined structures.

We claim:

1. A microbridge structure for detecting radiation, comprising: a substrate; a region of active material having a planar area; a microbridge for supporting said region of active material and separating said region of active material from the substrate to provide a gap between the substrate and said region of active material; and a planarizing layer provided in the gap for planarizing non-planar surface topography of the substrate to provide a substantially uniform separation of said region of active material and an upper surface of the planarizing layer over the planar area of said region of active material.

2. The microbridge structure according to claim 1, wherein the gap between the planarizing layer and said region of active material is a quarter of a wavelength of the radiation which the microbridge structure is to detect.

3. The microbridge structure according to claim 1, wherein the gap is an etched away part of a sacrificial material present between the substrate and said region of active material to leave the planarizing layer.

4. The microbridge structure according to claim 1, wherein the planarizing layer is a sol-gel deposit.

5. The microbridge structure according to claim 1, wherein the planarizing layer is selected from a group consisting of polyimide, zinc oxide and spin-on glass.

6. The microbridge structure according to claim 1, wherein the planarizing layer has a chemically mechanically polished surface to produce a planarizing effect.

7. The microbridge structure according to claim 1, wherein the active material comprises a ferroelectric material.

8. The microbridge structure according to claim 7, wherein the ferroelectric material is selected from a group consisting of lead zirconate titanate (PZT) and lead scandium tantalate (PST).

9. The microbridge structure according to claim 7, wherein the ferroelectric material is a layer deposited from a solution.

10. The microbridge structure according to claim 1, wherein the structure is operative for detecting the radiation by using the pyroelectric effect.

11. The microbridge structure according to claim 1, wherein the structure is a thermal radiation detector.

12. A thermal imaging device, comprising: an array of microbridge structures each of which comprises a substrate, a region of active material having a planar area, a microbridge for supporting said region of active material and separating said region of active material from the substrate to provide a gap between the substrate and said region of active material, and a planarizing layer provided in the gap for planarizing non-planar surface topography of the substrate to provide a substantially uniform separation of said region of active material and an upper surface of the planarizing layer over the planar area of said region of active material.

13. The thermal imaging device according to claim 12, wherein the array is two-dimensional.

* * * * *